United States Patent [19]
Abboud

[11] Patent Number: 6,147,859
[45] Date of Patent: Nov. 14, 2000

[54] MODULAR EXTERNAL PERIPHERAL HOUSING

[75] Inventor: Pierre Abboud, Encino, Calif.

[73] Assignee: OPS, Inc., Yorba Linda, Calif.

[21] Appl. No.: 09/376,787

[22] Filed: Aug. 18, 1999

[51] Int. Cl.⁷ .............................. H05K 7/02; G11B 33/00; F16B 12/00
[52] U.S. Cl. .......................... 361/683; 361/685; 361/686; 361/687; 361/728; 312/223.1; 312/223.2
[58] Field of Search ............................ 361/683, 684–686, 361/688, 687, 728–747; 312/9.1, 236, 283, 284, 286, 223.1, 223.2; 369/75.1, 77.1

[56] References Cited

U.S. PATENT DOCUMENTS

| | | | |
|---|---|---|---|
| 4,672,510 | 6/1987 | Castner | 361/415 |
| 4,833,554 | 5/1989 | Dalziel et al. | 360/98.04 |
| 5,187,645 | 2/1993 | Spalding et al. | 361/393 |
| 5,229,919 | 7/1993 | Chen | 361/391 |
| 5,410,141 | 4/1995 | Koenck et al. | 235/472 |
| 5,519,572 | 5/1996 | Luo | 361/685 |
| 5,532,889 | 7/1996 | Stefansky et al. | 360/97.01 |
| 5,563,767 | 10/1996 | Chen | 361/685 |
| 5,564,802 | 10/1996 | Chiou | 312/111 |
| 5,604,662 | 2/1997 | Anderson et al. | 361/685 |
| 5,654,874 | 8/1997 | Suzuki | 361/685 |
| 5,694,290 | 12/1997 | Chang | 361/685 |
| 5,764,131 | 6/1998 | Twining et al. | 340/311.1 |
| 5,805,416 | 9/1998 | Friend et al. | 361/686 |
| 5,959,834 | 9/1999 | Chang | 361/685 |
| 5,975,735 | 11/1999 | Schmitt | 364/131 |
| 6,011,687 | 1/2000 | Gluskoter et al. | 361/686 |
| 6,052,279 | 4/2000 | Friend et al. | 361/686 |
| 6,061,232 | 5/2000 | Ho | 361/685 |

FOREIGN PATENT DOCUMENTS 7-282569  10/1995  Japan .............................. G11B 33/02

*Primary Examiner*—Leo P. Picard
*Assistant Examiner*—Anatoly Vortman
*Attorney, Agent, or Firm*—Fulwider Patton Lee & Utecht, LLP

[57] ABSTRACT

An external casing having a modular design for encasing a variety of hardware peripherals within an interior compartment formed by releasably engaging upper and lower halves that receive an interchangeable interface panel and allow the passage of air above and below the peripheral, thereby eliminating the need for a cooling fan internal of the casing.

26 Claims, 6 Drawing Sheets

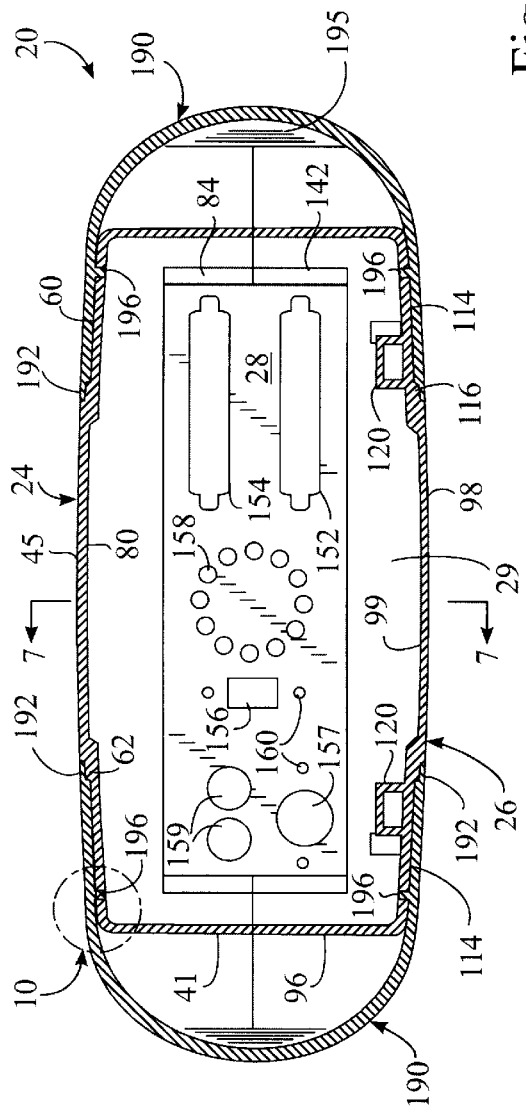
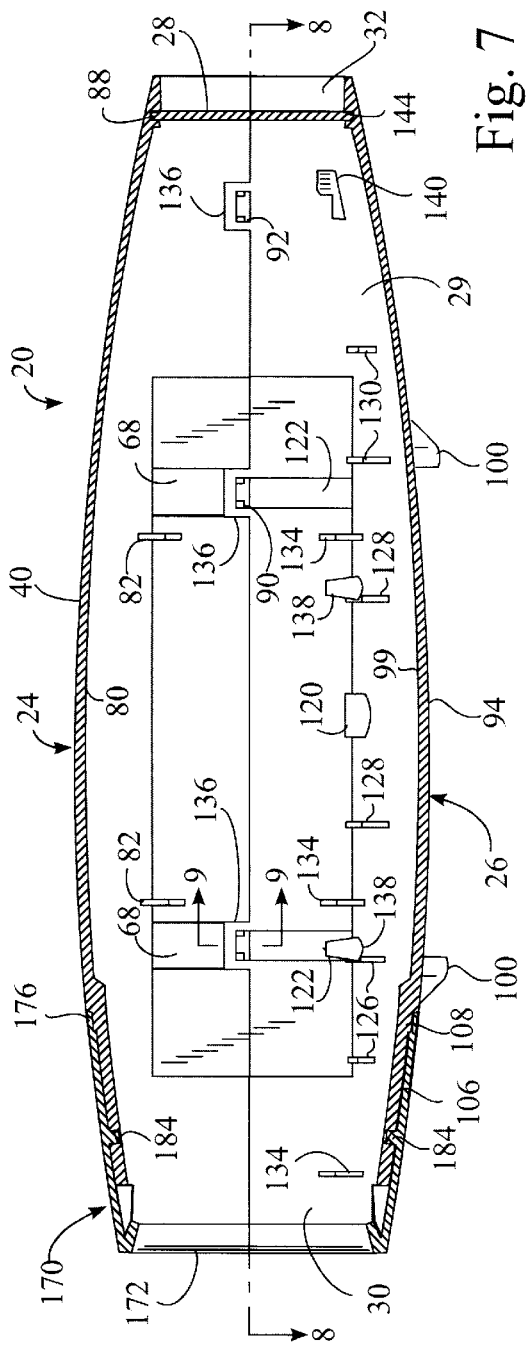
Fig. 6
Fig. 7

MODULAR EXTERNAL PERIPHERAL HOUSING

BACKGROUND OF THE INVENTION

1. Field of the Invention

The invention relates generally to housings for electrical components and more specifically, to housings for external computer peripherals.

2. Description of the Prior Art

The popularity of external hardware peripheral equipment for computers arises in part from the convenience of merely plugging the peripheral into the computer via an interface cable thereby saving the user from opening up the casing of the computer. In addition, many external devices are designed to be plugged into a main hub and would otherwise be restricted by the internal size and number of internal sockets of the main processor housing. The main focus of hardware designers working on these devices has been improving the technical performance of the internal components. As a result, limited forethought has been introduced into the external casing of the device.

Currently, typical hardware peripherals such as drives of the CD-ROM, CD-R, CD-RW, Hard, Floppy, DVD, Tape, WORM, Jaz, and Zip variety have their main working components encased in a close fitting metallic casing for internal use within a computer. To be transformed into an external device, the drive is typically enclosed in a second slightly larger casing. This external casing is typically metal and is generally held together by threaded fasteners.

In addition to the drive, the external casing typically accommodates a cooling fan, a power supply, and an interface connector specific to the internal device. In other words, the external casing is typically designed and limited to the incorporation of an interface panel for a specific interface connector such as a Small Computer Serial Interface (SCSI), parallel, or Universal Serial Bus (USB) connector. The casing is not readily adapted to alternate connectors and a differently configured housing must be procured or developed. An internal interface cable connects the drive to the interface connector at the back of the casing. An external cable is then used to connect the external drive to a desired port on the rear panel of a central processor.

Other external casings are available including towers or cabinets designed to hold multiple drive units. Typically, the drives are vertically aligned on shelves or brackets throughout the cabinet. This type of external casing is also metal and sometimes incorporates multiple fans to cool multiple drive units.

Several drawbacks are readily apparent from the current external casing designs. The metallic casings add an unnecessary amount of significant weight to the external peripheral. Since structural support is not a major design concern, the overall weight of the product could be reduced. The casings are also generally secured by threaded fasteners which increases both assembly time and deassembly time.

The incorporation of a fan for cooling the drive adds significant weight to the product and contributes to a reduced meantime between failure because the fan is typically the first component to fail.

Conventional external peripheral casings are tailored to a particular model or manufacture and typically tightly enclose the internal unit. As a result, conventional casings do not provide a standard casing capable of housing components of a variety of shapes and sizes. Along these same lines, current external casings are typically constructed to contain an interface panel of a particular design or model and do not readily accept alternative interface panels without significant modification to the casing. Another notable design limitation is that the individual peripherals, when stacked, typically do not resist motion in relation to one another and are easily misaligned.

What is needed and heretofore unavailable is an easy to assemble, modular external casing made of a light weight material that facilitates different sized drives and alternative connectors while providing an improved stacking relationship to other housings.

SUMMARY OF THE INVENTION

In accordance with a preferred embodiment of the present invention, a modular external housing for encasing an electrical component such as a computer hardware peripheral is provided and includes an upper half having an arcuate top portion flanked by downwardly projecting side walls that terminate in a first fastener element. A lower half includes a support tray for supporting the peripheral and upwardly projecting side walls that terminate in a second fastener element for releasable engagement with the first fastener element. The two halves when releasably fastened together form an interior compartment for receipt of the peripheral device and a pair of upper and lower tracks for slidable receipt of an interface panel. The resulting housing accommodates peripherals of varying dimensions and an easily interchangeable interface panel enables the housing to be assembled with a variety of interface connectors.

Another feature of the present invention is a housing that is constructed to allow passage of air above and beneath the peripheral thereby effectively eliminating the need for a cooling fan.

The present invention may also incorporate several finishing attachments such as a pair of side covers that cooperate with the side walls of the housing to form a storage area. A frontal slot reducer is releasably mounted over the front access slot of the housing to reduce the frontal cross sectional area.

Other features and advantages of the present invention will become more apparent from the following detailed description of the invention, when taken in conjunction with the accompanying exemplary drawings.

BRIEF DESCRIPTION OF THE DRAWINGS

FIG. 6 is a lateral cross section, in enlarged scale, taken along lines 6—6 as shown in FIG. 3;

FIG. 7 is a longitudinal sectional view taken along lines 7—7 as shown in FIG. 6;

Numerous advantages and aspects of the invention will be apparent to those skilled in the art upon consideration of the following detailed description which generally provides illustrations of the invention in its presently preferred embodiments.

DETAILED DESCRIPTION OF THE PREFERRED EMBODIMENT

Figure 1:
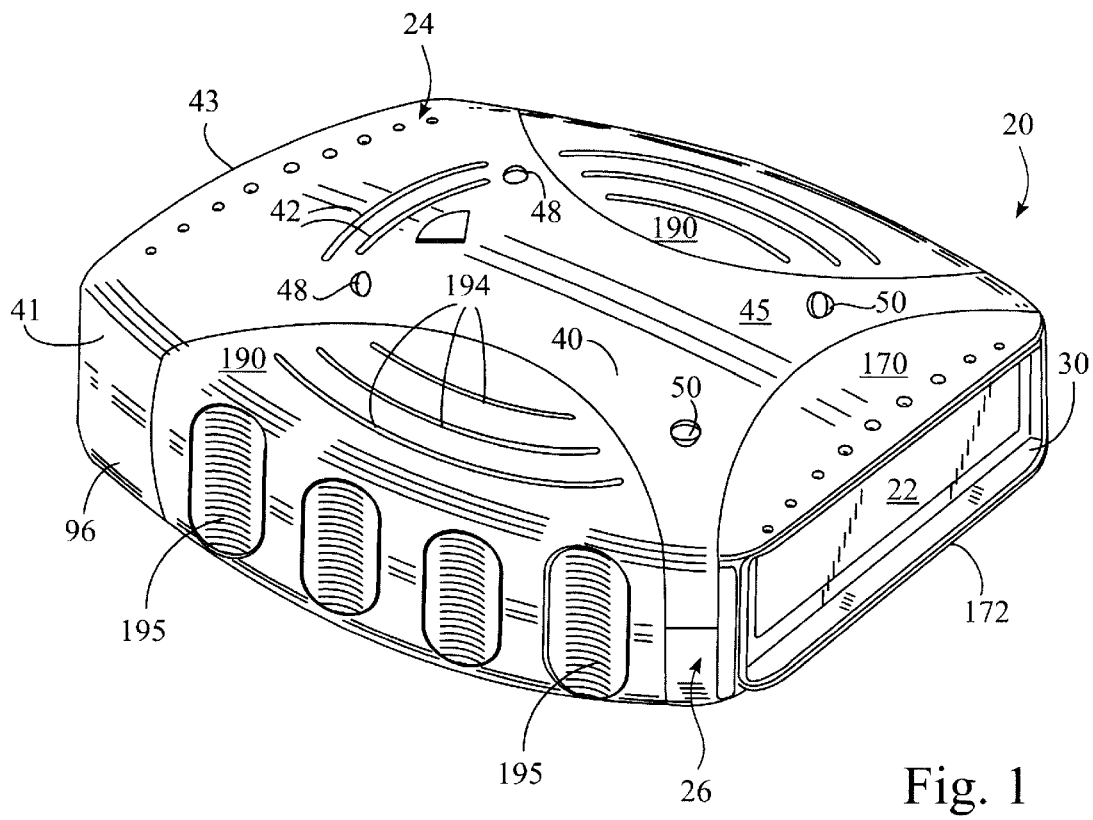
FIG. 1 is a forward perspective view of a device embodying the present invention.
Figure 2:
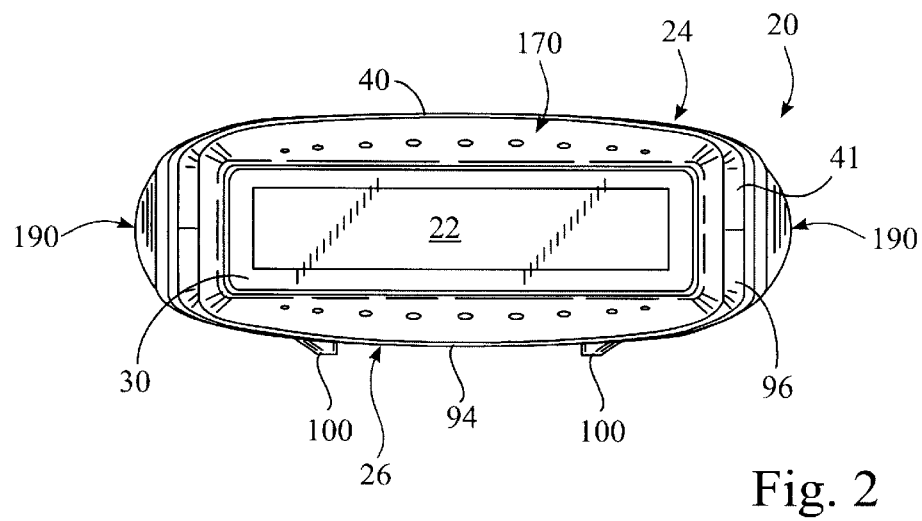
FIG. 2 is a front view of the device shown in FIG. 1.
Figure 3:
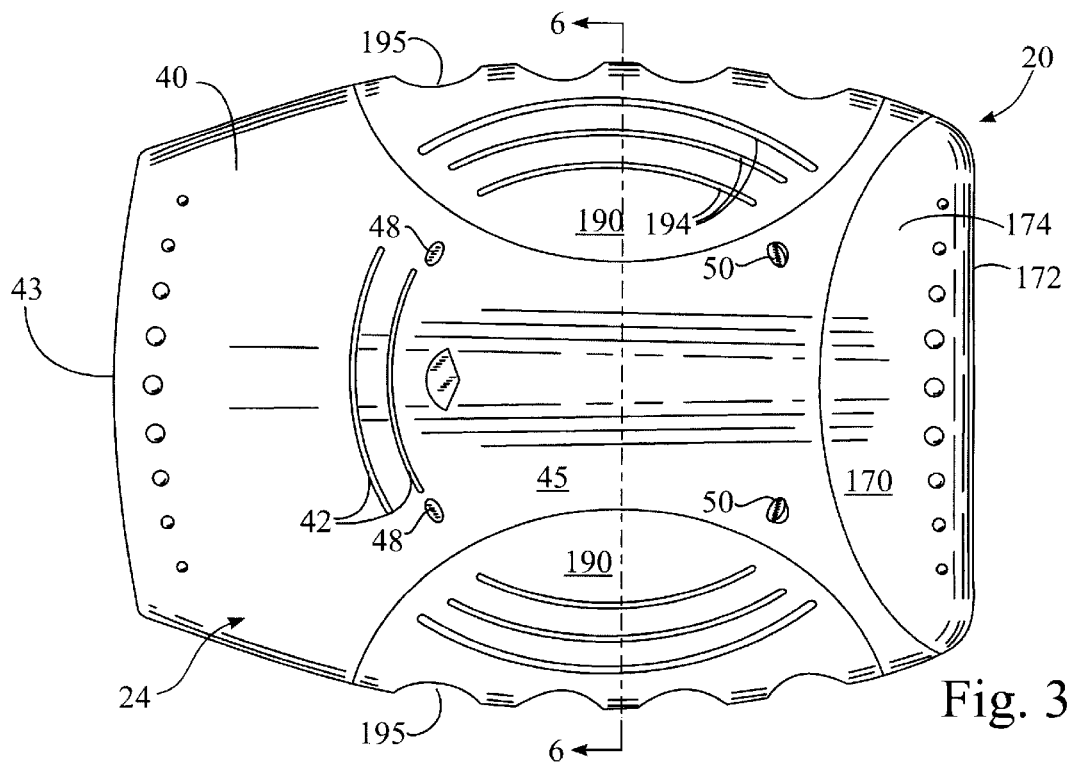
FIG. 3 is a top view of the device shown in FIG. 1.
Figure 4:
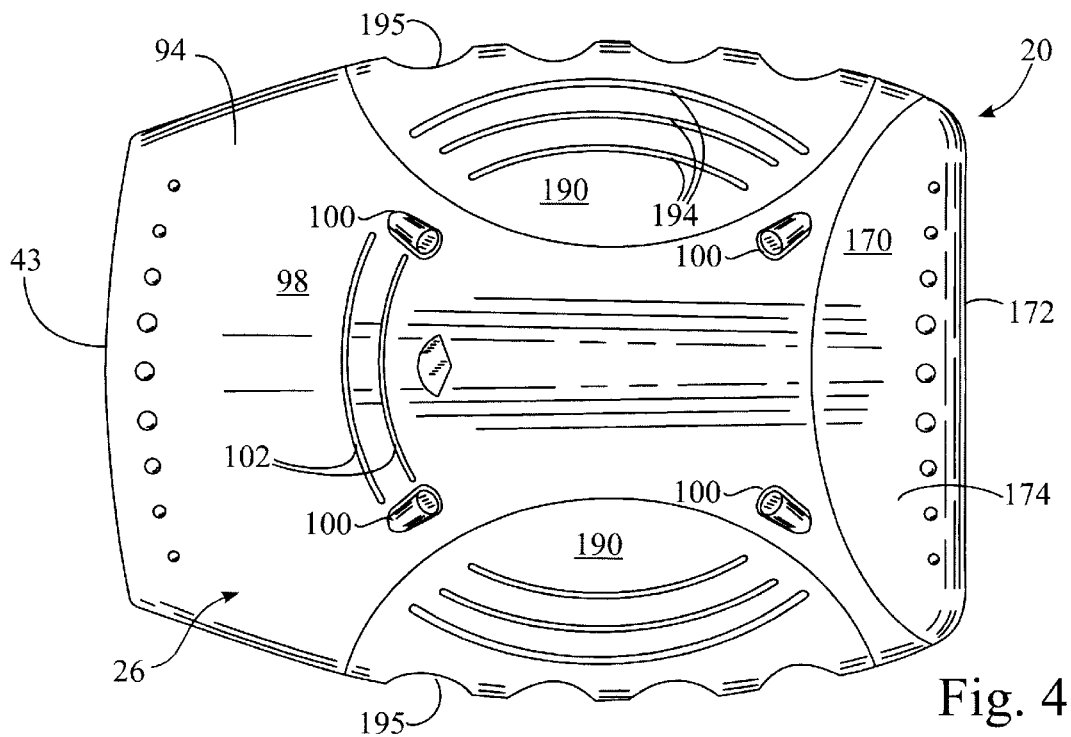
FIG. 4 is a bottom view of the device shown in FIG. 1.
Figure 5:
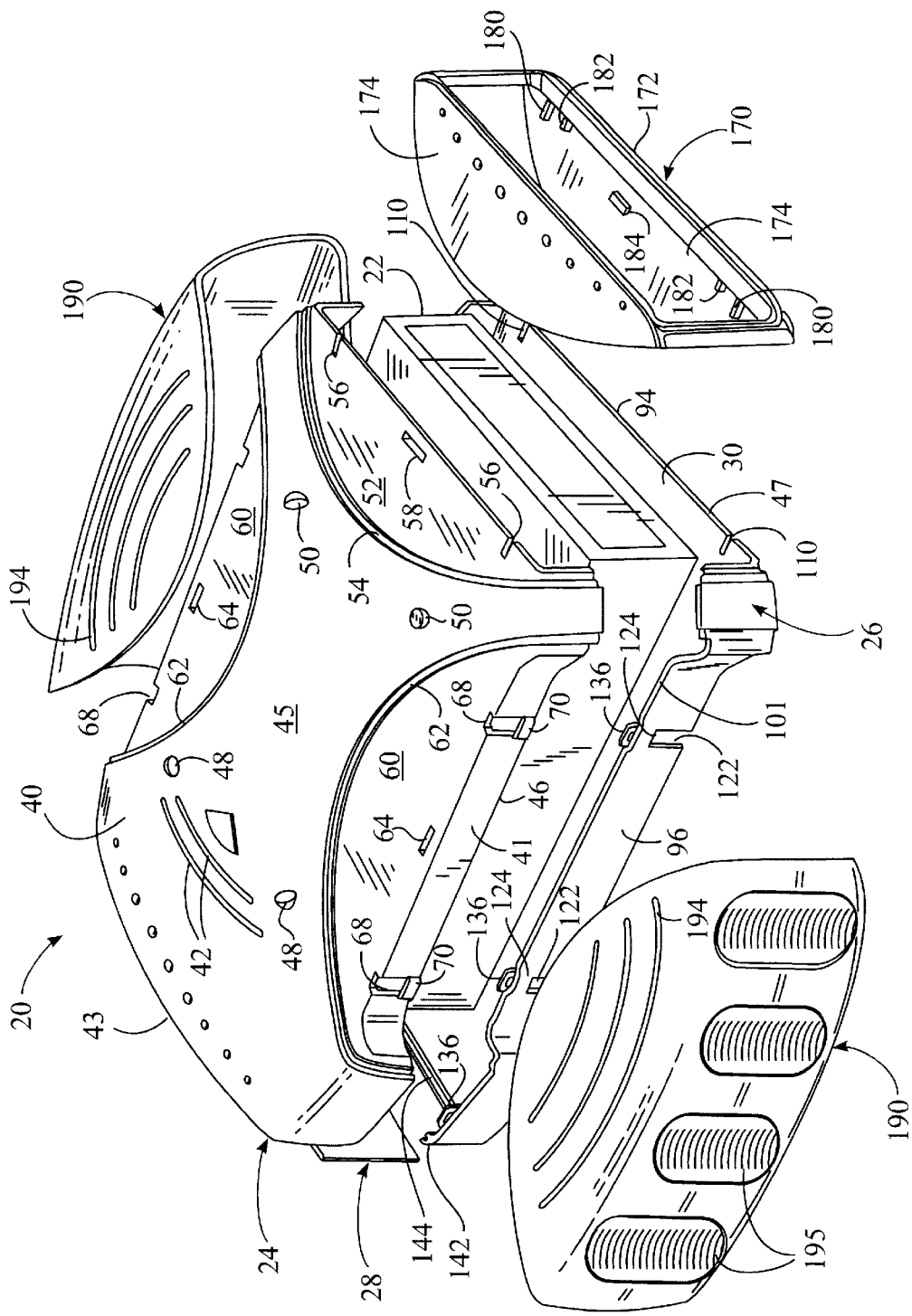
FIG. 5 is an exploded perspective view of the device shown in FIG. 1.
Figure 8:
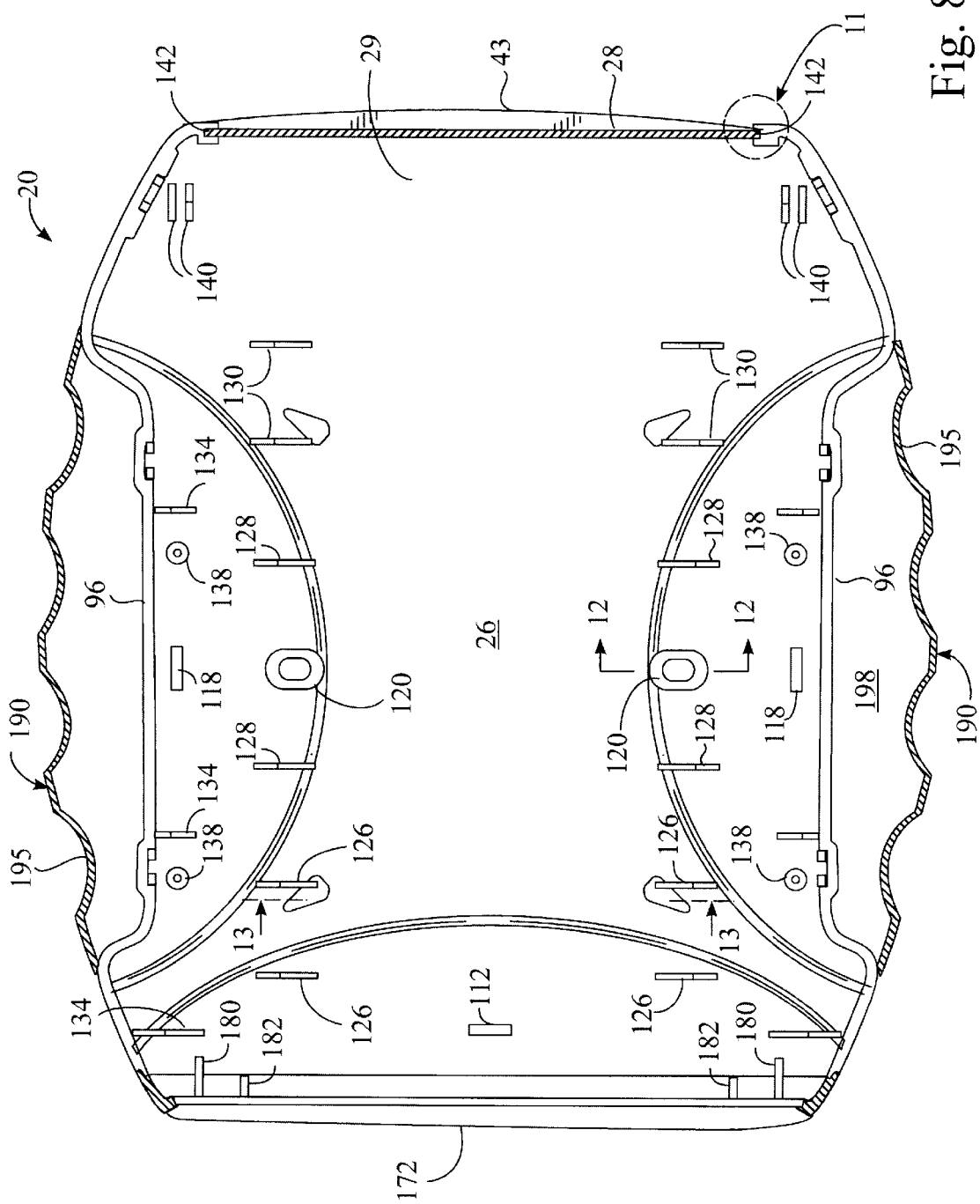
FIG. 8 is a top sectional view taken along lines 8—8 as shown in FIG. 7.

Referring now to FIGS. 1–8, an external housing or casing, generally designated 20, is provided for enclosing a hardware peripheral, generally designated 22 (FIG. 5). The housing generally comprises an upper half 24, a lower half 26, and a rear interface panel 28 constructed to carry an array of connector devices. The assembled upper and lower halves form an interior compartment 29 with a frontal access opening 30 and an opposing rear access opening 32. The housing is designed to receive the hardware peripheral within the interior compartment such that its front panel is proximate the frontal access opening and its rear connective ports are proximate the rear access opening.

The upper half 24 is generally an inverted channel shaped cover formed with a central dome portion 40 that is generally arcuately shaped when viewed in longitudinal cross section. For purposes of illustration, the longitudinal direction is defined as a projection from a midpoint of the rear access opening to the midpoint of the frontal access opening. The arc of the dome is gradual and generally maintains a relatively small acute tangential angle. The dome portion is also gently arched when viewed in lateral cross section. The apex of the domed portion is slightly foreward of the longitudinal midpoint of the housing and may be slightly flattened. The dome portion terminates at one end in a curved trailing edge 43 and at the opposite end in a straight leading edge 47. A pair of downwardly projecting side walls 41 flank the domed portion. The lowermost extremity of the side walls forms a lower edge 46 that defines the lower boundary of the channel.

The exterior surface 45 of the dome portion 40 includes several additional features. A pair of spaced apart, curved, grip ridges 42 is formed near the rear edge 43 of the dome portion. The use of these ridges will be described in detail below. The ridges are slightly raised from the exterior surface of the domed portion and are generally concave when viewed from the midpoint of the housing. The ridges have approximately the same radius of curvature with the inside ridge defining a smaller arc than the outside ridge.

Also featured on the exterior surface 45 of the domed portion 40 is a set of four grooves including a pair of rearward grooves 48 and a pair of opposing frontal grooves 50. The rear grooves 48 form a relatively shallow indentation in the exterior surface 45 of the domed portion and are generally elliptically shaped. The frontal grooves 50 are also substantially elliptically shaped but are recessed to a greater degree into the exterior surface of the domed portion than the rear grooves. The rearmost wall of each of the forward grooves is substantially vertically inclined while the foremost wall of the each of the forward grooves is forwardly inclined. The shorter axes of all four grooves are substantially inclined to the center of the dome.

The exterior surface 45 also includes a forward semi-circular recess 52 projecting rearwardly from the leading edge 47. A semi-circular ledge 54 borders the circumference of the recess. A pair of alignment slots 56 project rearwardly from the leading edge into the recess and a rectangular engagement slot 58 is perpendicularly aligned with the alignment slots and disposed centrally within the recess.

On each side of the dome portion 40 is a side recess 60. Each side recess includes a semi-circular region that includes a substantially horizontal projecting upper portion within the domed portion. The horizontal portion transitions at the outer edge of the dome portion into a downwardly projecting portion onto the respective side wall 41. A ledge 62 is peripherally situated around each recess. In each of the upper portions of the recesses 60, there is a longitudinally projecting cover retention slot 64 centrally disposed within the recess. The recess is more pronounced along each side wall than the upper recessed portion. In other words, the recess along the side wall is deeper than that portion of the recess along the domed portion of the upper half. Within each side wall 41, a pair of windows 68 provides a through opening from the exterior surface of the upper half to the interior. Each generally rectangularly shaped window is defined on the lower most sides by a cross strip 70.

The interior surface 80 of the upper half includes a set of four substantially L-shaped guides 82 for disposition against the upper surface of a larger drive device 22. The guides also support the domed portion and the upper side walls 41. The downwardly projecting leg of the guides rests against the sides of the drive device and function to inhibit sideways movement of the drive within the compartment 29. Located in the rear portion of the upper half is a pair of vertically projecting upper tracks 84. The tracks are situated on opposite sides and each track includes a vertical slot dimensioned to receive an edge of the interface panel 28. A transversely running groove 88 for receipt of the upper edge of the interface panel may also be incorporated for additional restraint of the interface panel.

On the interior of each cross strip 70 is a pair of inwardly inclined barbs 90 providing a preferred form of a first fastener element. Each barb is flattened on its uppermost surface forming a ledge. A pair of dual barb sites 92 are also located near the rear tapered portion of the upper half to ensure a close fitting engagement near the back edge 43.

Turning now to FIG. 4–8, the lower half 26 is generally channel shaped with a central support tray 94 adjoined at the sides to a pair of upwardly projecting side walls 96 that terminate in an upper rim 101 which defines the upper boundary of the lower half. The central support tray is generally arcuately shaped when viewed in longitudinal cross section. The lower half generally includes an exterior surface 98 and an interior surface 99. The exterior surface 98 includes a set of four support legs 100 that are inclined toward the center of the lower tray. Each of the support legs includes a lowermost surface formed with an elliptical shape to complement the grooves 48 and 50 on the upper surface of the upper half. The legs are also spaced apart in the same manner as the grooves. This facilitates the stacking of one housing upon another because each leg will align with one of the grooves. The depth of the grooves 48 and 50 prevents the legs and thus the adjacent stacked housing from inadvertently sliding off the lower housing. A pair of lower curved gripping ridges 102 is formed on the exterior surface of the lower tray between the rear legs. The ridges are configured in a similar manner and positioned directly beneath their upper half counterpart ridges 42.

There are also three recessed portions on the exterior surface 98 of the lower half 26 and upwardly projecting side walls 96. A forward semi-circular recess 106 projects rearwardly from the straight forward edge 47. The recess is bordered by a semi-circular ledge 108. Two lower half alignment slots 110 are situated on opposing sides of the recess and project rearwardly into the recessed region. A lower rectangular engagement slot 112 is disposed centrally with the forward recess.

Each side wall includes a side recess 114 having a vertical portion along the respective side wall 96 and an inwardly turned substantially horizontal portion that extends into the lower tray 94 in the form of a semi-circular recess. The recess is circumscribed by a raised ledge 116. Each side wall portion of the recess is significantly deeper than the respective recessed portion that extends into the lower tray. Within the horizontal portion of the recess is a longitudinally projecting side cover engagement slot 118 generally centrally located within the horizontal portion of the recess. Inwardly situated from the engagement slot 118 is an oblong fastener slot 120 providing a through access bore to the interior compartment 29 of the housing 20. The slot is provided with a shoulder so that the head of fastener such as a broad headed screw 121 is prevented from entering the bore. Along the vertical portion of each lower half side recess 114 is a pair of lower half windows 122. Each window is defined at its top edge with a cross strip 124 adding structural support to the lower half near the window.

The interior surface 99 includes forward 126, intermediate 128, and rear 130 pairs of spaced apart, L-shaped, support flanges on opposing halves of the lower tray 94. These support flanges are formed between the respective side wall and the longitudinal centerline of the lower tray 94. The forward pairing of support flanges 126 is proximate the forward leading edge 47. The intermediate pairings of support flanges 128 are disposed on either side of the fastener slot 120. Positioned rearwardly of the intermediate support flanges are the rear pairs of support flanges 130. The flange pairings cooperate to form an elevated seat off the interior surface 99 of the lower tray 94 for the drive 22 which allows air to flow underneath the drive thereby providing an additional area of heat exchange with cooler ambient air. These flanges are spaced apart to accommodate a variety of electrical components such as the drives mentioned herein which may have different lengths and widths. For example, some drives may only reside on two of the three pairings of support flanges, while other drives will rest on all three pairings. The drives are not restricted from longitudinal movement within the compartment by the flanges alone. A fastener such as a screw can be inserted into the fastener slot to engage a threaded bore commonly found in conventional drive casings. The drive can be shifted longitudinally to align such threaded bore with the fastener slot prior to fastening the drive to the lower tray.

For those drives 22 that are even larger in width than most conventional drives, two sets of three opposing support shelves 134 are disposed against the interior of the respective side walls 96. These support shelves includes a lower horizontal portion that is slightly higher than the highest point of any of the support flanges 126, 128, and 130. This enables the larger model drive to rest directly on the shelves and avoid interference from the support flanges. Positioned slightly forward of each of the support shelves is an anchor 138 generally conical in shape and projecting upwardly from the interior surface 99 to terminate in a tapered tip. The anchor tip is elevated above the horizontal portion of the nearby support shelf and constructed to be received within either threaded bores or other apertures within the peripheral 22 to assist in restricting lateral and longitudinal movement within the compartment.

Fastener tabs 136 in the form of a plastic loop project upwardly from each of the cross strips 124 on the lower windows and also from designated positions in the tapered portion near the rear edge of the lower tray. These fastener tabs cooperate to form the second fastening element to releasably engage the upper 24 and lower 26 halves. Each second fastener element is positioned to align with the corresponding first fastener element, that is, the barbs indicated at 90 and 92 located on the upper half.

In the rear tapered portion of the lower tray are a pair of cable retention members 140. These provide a spaced apart channel for retention of a portion of an interface cable (not shown) between the drive and the interface panel 28 in order to keep the cable in a desired position.

Near the trailing edge 43 of the lower tray 94 is a set of opposed lower tracks 142 separated by a transverse lower groove 144 recessed into the interior surface of the lower tray to receive the lower edge of the interface panel 28. This lower groove is substantially parallel to the upper groove 88 on the upper half when the two halves are assembled together. The lower tracks are positioned within the lower tray to align with the respective upper tracks 84 on the upper half 24 of the housing 20 upon mating engagement of the two halves.

The upper 24 and lower 26 halves are preferably made from a light weight, semi-rigid polycarbonate or ABS polycarbonate material. Other materials well known in the art are also contemplated. The assembled structure is sufficiently rigid to support a number of stacked peripheral devices. Each half is also sufficiently flexible to allow the fastener elements to releasably engage as will be described below.

Referring to FIGS. 5–6, a rectangular, exchangeable, interface panel 28 is provided to carry an array of interface connectors and devices that transfer data to and from the drive 22 mounted in the compartment 29. The panel or plate is dimensioned on its vertical edges to slidingly fit within the upper 84 and lower 142 tracks. The upper and lower edges of the interface panel are constructed to fit with the respective upper and lower grooves 88 and 144. When the interface panel is within the housing halves it is clamp fitted into place and is not removable until the halves are disassembled. It will be appreciated that a variety of panel shapes could be used without detracting from the scope of the present invention.

An array of openings is set within the interface panel 28. The openings are generally shaped and sized to accommodate various connectors and other components required to provide power of other indications of activity within the drive 22. Because the present invention is designed to be flexible, rear interface panels may include different arrays of openings for use in conjunction with a particular model drive. For purposes of illustration, but not in any way limited to, the interface panel (FIG. 6) includes openings generally for a Small Computer System Interface (SCSI) input port 152 and output port 154. An additional switch opening 156 is provided for a component such as a slide switch (not shown) to power on a power supply. An RCA audio input/output jack opening 159 may also be provided. A DC power supply opening 157 is provided for a hooking power up the drive 22. A ring of openings 158 is provided to allow air to escape through the rear interface panel. Other openings for connectors such as a Universal Serial Bus port, parallel port, PC card slot, or LED openings may be substituted for as necessary. The interface panel is in no way restricted from accommodating the wide variety of connector, power, or indicator options known in the art. Additional openings 160 may also be provided to accommodate fasteners for the various connector devices.

The interface panel is preferably formed from a metallic material and the various openings may be stamped out by methods well known in the art. The compressive resistance of the interface panel supports the rear end of the housing 20. While the tracks and rectangular panel configuration accommodate a quick and easy interchange of interface panels, other means could be used to releasably engage the interface panel with the housing.

Figure 12:
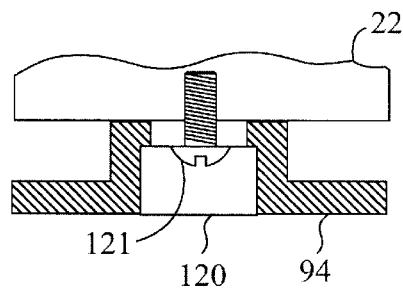
FIG. 12 is a transverse sectional view, in enlarged scale, taken along lines 12—12 as shown in FIG. 8.

Assembly of the housing is a straight forward matter and forms the interior compartment 29 for the drive 22. Starting with a completely unassembled housing as shown in FIG. 5, the assembler would first place the lower half 26 on a flat, stable, working surface. The desired electrical component, in this example, such as any of the drives 22 mentioned above, is placed on the notches of the support flanges as dictated by the size of the drive such that the drive is elevated from the interior surface of the support surface and resists lateral movement due the flanges. If the use of the locking screw is desired, the threaded bore of the drive is aligned with the oblong slots 120 and a threaded fastener 121 is secured therein (FIG. 12). The locking screw may be used to add additional security to the attachment but is not deemed necessary to the invention.

Figure 11:
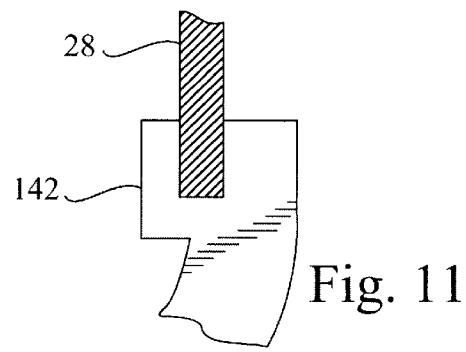
FIG. 11 is a sectional view, in enlarged scale, taken from circle 11 as shown in FIG. 8.
Figure 14:
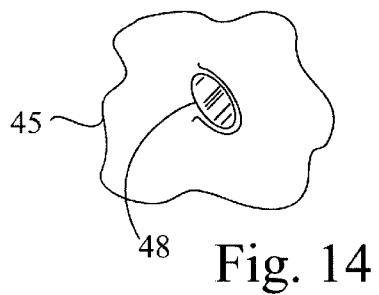
FIG. 14 is a top view, in enlarged scale of the stacking groove taken along lines 14—14 as shown in FIG. 13.

A preselected rear interface panel 28, having been stamped and fitted with the desired interface components (not shown), is then slidably inserted into the vertical lower tracks 142 in the lower half 26 near the rear edge (FIG. 11). The bottom edge of the panel is nested within the transverse groove 144. The peripheral 22 is then connected to the interface panel by methods well known in the art, such as internal cables, so that input and output may be sent from and issued to the drive upon further connection to a processor. A power supply is also connected to between the drive and the panel.

The top half 24 of the housing 20 is then positioned over the lower half of the housing such that the upper tracks 84 slidably engage the vertical upper edges of the interface panel 28. The upper half continues to slide onto the interface panel until the first fastener element is aligned with the second fastener element and the lower edge 46 abuts the complementary upper rim 101. The two halves are then pressed together until the fastener elements lock together. This process is noticeably easier and faster than using threaded fasteners to secure conventional casings.

Figure 9:
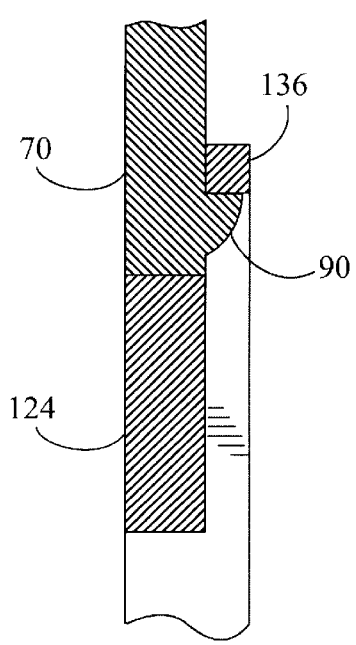
FIG. 9 is a transverse sectional view, in enlarged scale, taken along lines 9—9 as shown in FIG. 7.

In more detail and referring now to FIG. 9, the lower loop 136 will bend inwardly and slide along the inclined portion of the respective barbs 90 as the two halves 24 and 26 are pressed together. Once the lower edge of the loop is past the top flat portion of the barbs, the resilient loop will snap back into alignment and nest against the upper half. If a battery pack is used instead of a conventional power supply, it is attached to the one of the sides and the power cord inserted through a window 68 or 122 in the selected side and connected to the drive. VELCRO® brand strips or other commonly used fasteners may secure the pack to the side wall.

When assembled the channel shaped halves form a frontal access opening 30 and rear access opening 32. The frontal access opening enables the user to access the front of the peripheral such as the disc tray of a CD-ROM drive. The rear access opening is generally occupied by the rear interface panel so that connections may be made from the drive to a processor or other device. The upper half side recesses and lower half side recesses are also aligned upon assembly of the housing and form respective unitary wraparound recesses on both sides of the housing 20.

It is a simple matter to disassemble the housing. The flexibility of the housing enables the disassembler to merely push inwardly on the lower half cross strips 124 one at a time. The respective loop 136 will be forced off the flat portion of the barb 90 and release the first fastener. Once this is done at each fastener mating, the halves will separate and the drive can be disconnected from the interface panel which may be then be slidably removed from the lower tracks 142. An alternate interface panel with a different array of connectors may be substituted as desired. The drive may be unscrewed from the fastener 121 and removed from the lower tray 94. A new peripheral may then be placed within the tray to prepare for the next assembly operation.

While the upper half 24, lower half 26, and interface panel 28 comprise the essential components of the housing, several additional components may be added to enhance the utility of the housing. One such component is a frontal slot reducer 170 that provides a primarily aesthetic cover for the forward slot 30 of the assembled housing 20. The reducer is substantially symmetrical about longitudinal and lateral centerplanes. From the forward edge 172 of the slot reducer, the reducer diverges in a V-shaped cross section with the outer leg extending into a pair of upper and lower covering skirts 174 that project rearwardly and terminate in a semi-circular curved edge complementing the curved edge of the upper 52 and lower 106 recesses of the housing 20. A thin lip 176 is peripherally disposed around the frontal slot reducer. This lip rests on the respective semi-circular ledges 54 and 108 when mounted thereon. The inner leg of the reducer extends inwardly to form a periphery defining an opening having a cross sectional area less than the access opening 30.

Extending rearwardly from the front edge on the interior of the reducer 170 is a group of upper and lower alignment fins 180. These fins are dimensioned and positioned to be inserted within the corresponding alignment slots 56 and 110. A set of four shoulders 182 abuts the leading edge 47 of the housing when the reducer is mounted to the housing. Interlocking flanges 184 are positioned within each of the skirts and project inwardly from interior surface of the respective reducer skirts. These flanges are sized to enable placement within the corresponding upper engagement slot 58 and lower engagement slot 112. While the reducer shown includes alignment fins that determine a particular orientation of mounting the reducer, it will be appreciated that for further ease of assembly, the reducer could be made symmetrical and the alignment slots of the housing could be made symmetrical such that the top and bottom of the reducer are interchangeable.

The frontal slot reducer is preferably made of a polycarbonate based material and is flexible enough to snap fit onto the assembled housing. The reducer may be completely transparent or tinted as the market demands.

Figure 10:
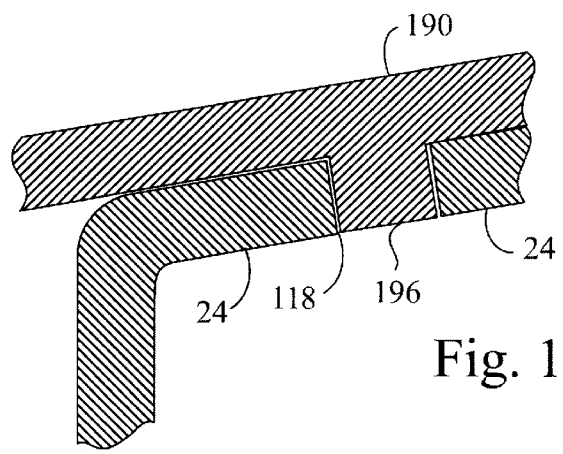
FIG. 10 is a sectional view, in enlarged scale, taken from circle 10 as shown in FIG. 6.

To releasably mount the reducer 170 to the assembled housing, the assembler first orients the reducer so that the alignment fins 180 will be properly aligned with the corresponding alignment slots 56 and 110. The complementary shape of the reducer facilitates placement upon the housing. The reducer is then slid over the front access opening 30 such that the fins 180 are driven into the respective alignment slots and the shoulders 182 abut the leading edge 47 of the housing. At this time, the interlocking flanges 184 are positioned to engage and nest within the respective engagement slots 58 and 112. While FIG. 10 shows a detail of the side cover fitting with the housing, it is analogous to the present interlocking structure and may be referred to for guidance. When properly installed, the exterior surface of the reducer 170 will be substantially flush with the exterior surface of the housing and the lip 176 rests upon ledges 54 and 108. It will be appreciated that because the reducer merely snaps into the correction position and is not permanently secured, it is easily removed when necessary. Removal of the reducer is further facilitated by grasping the housing by the upper 42 and lower 102 gripping ridges.

A pair of identical side covers 190 are also provided to finish off the unitary side recesses formed by the union of the upper and lower halves. The side covers also conceal and protect any battery packs that may be mounted within the side recesses of the housing. Each side cover is substantially C-shaped with the central portion being slightly flattened. The upper and lower arms are formed with a contour to complement the upper and lower recesses of the housing. A peripheral lip 192 rests on the ledge formed in the recess when the cover is placed on the housing. The exterior surface of the cover is formed to be essentially flush with the exterior surface of the housing. Each side cover includes a set of three curved gripping ridges 194 on its exterior surface of the arm regions. The ridges are curved in an opposing orientation to the curved edge of the side cover. The exterior surface of the flattened portion of each side cover includes a set of four relatively smooth surface depressions 195. These depressions are wide enough to accommodate most users' fingers and provide a convenient area to lift and carry the housings.

On the interior of each side cover 190 is a pair of opposing upper and lower tab inserts 196 for removable insertion into the respective cover retention slots 64 and 118. The side covers are dimensioned to be flush with the horizontal portions of the unitary recess, but provide a gap 198 between the respective side wall and the flattened portion of the side cover. The gap is preferably sized to accommodate placement of a battery pack to support the internally mounted drive as an alternative to the inclusion of a power source such as a DC power supply.

The side covers are typically manufactured from a light weight, semi-rigid ABS polycarbonate or non-ABS polycarbonate. The flexibility of the covers ensures repeated uses over a long period of time.

To incorporate the side covers 190 on the housing, each side cover is aligned with the corresponding side recess and slid over the recess until the tabs 196 lock into the small slots 64 and 118 on the upper and lower halves (FIG. 10). The gripping ridges 194 assist removal of the side covers which is accomplished by prying one of the edges upwardly and outwardly away from the housing.

The assembled housing, with or without the reducer 170 and side covers 190, is then placed near a selected processor unit and the rear interface panel is then connected to the main unit such as a Central Processor Unit as is well known in the art using conventional cables or similar connective means. It will further be appreciated that when the reducer and side covers are used, they provide additional structural integrity by reinforcing the assembled housing. By snapping into and effectively connecting the upper half to the lower half, the reducer and side covers provide alternate stress paths in case the housing is dropped or otherwise impacted. Consequently, the occurrence of the housing halves being prematurely released from one another due to such impact is significantly reduced.

Figure 13:
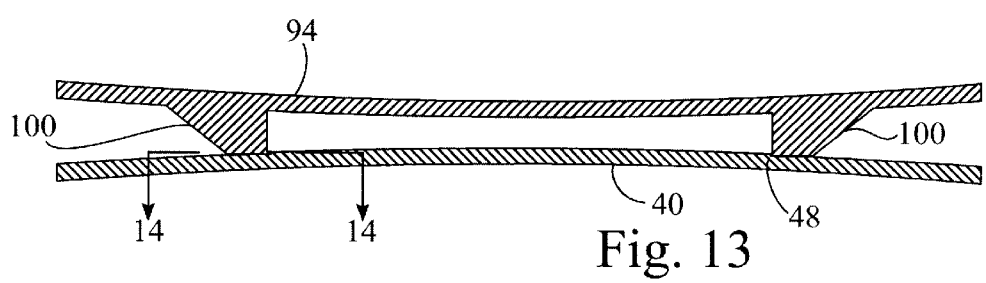
FIG. 13 is a transverse sectional view, in enlarged scale, taken along lines 13—13 as shown in FIG. 8, of the stacking relationship of two devices embodying the present invention.

Additional housings 20 may be stacked in the following manner. Subsequent housings are placed upon a lower housing by placing the legs 100 projecting from the lower surface of the upper housing into the leg receiving grooves 48 and 50 formed in the upper surface of the lower housing (FIG. 13). These grooves resist movement of the upper housing in relation to the lower housing. The rigid plastic housing is constructed sufficiently strong to support multiple housings.

The above-described invention provides advantages of a light weight, easy to assemble, modular, stackable unit that may omit the use of a cooling fan and provides an exchangeable interface plate to accommodate a variety of peripherals. The housing could alternatively be dimensioned to function as a housing for a personal computer or Internet access box, whereby a plurality of components such as motherboards, hard drives, CD-ROM drives, modems, and other conventional components could all be contained within the housing described herein. Other electrical devices such as stereos, CD-players, VCR's and related components could also easily be accommodated by the snap together housing embodied in the figures.

It will further be understood that the present invention is not limited to any particular platform such as the Macintosh, Windows, or UNIX systems. In addition, the interface panel may be constructed to accommodate any connector well known in the art and is not limited by the examples provided herein. It will also be appreciated that alternative fasteners configured for releasable engagement as are well known in the art such as snaps or clips are also contemplated and would be within the scope of the present invention. The number of fasteners and locations could also be modified without detracting from the scope of the present invention.

While several forms of the present invention have been illustrated and described, it will also be apparent that various modifications may be made without departing from the spirit and scope of the invention.

What is claimed is:

1. A housing for encasing a computer peripheral device comprising:

an upper half having a domed top portion flanked by a pair of downwardly projecting side walls having a first fastener element, said upper half further including a pair of opposing upper tracks;

a lower half configured with a lower support surface adjoined to a pair of upwardly projecting side walls having a second fastener element configured for releasable engagement with said first fastener element, said lower half further including a pair of lower tracks for alignment with said upper tracks;

an interface panel configured to be slidingly received in said upper and lower tracks and further formed with at least one opening for carrying interface components to be connected between the peripheral device and a second device; and wherein said halves cooperate when engaged to form an interior compartment for receipt of the electrical device and a forward port for access to the electrical device.

2. The housing as set forth in claim 1 wherein:

said lower support surface includes support legs.

3. The housing as set forth in claim 1 wherein:

said interface panel is rectangular.

4. The housing as set forth in claim 2 wherein:

said top portion includes a set of grooves constructed such that the legs of an additional housing may be placed therein.

5. The housing as set forth in claim 1 further including:

at least one C-shaped side cover constructed to releasably engage one side of the housing.

6. The housing as set forth in claim 5 wherein:

said side cover includes a fingergrip region having a plurality of depressions.

7. The housing as set forth in claim 1 further including:

a frontal slot reducer releasably engaged with said forward port of the housing and having an open area of smaller cross section than said forward port.

8. The housing as set forth in claim 5 wherein:

said C-shaped side cover is dimensioned to provide a storage area between the interior of said side cover and said side walls of the housing.

9. The housing as set forth in claim 8 further including:

a battery pack stowed in said storage area.

10. The housing as set forth in claim 1 wherein:

the interior surface of said support surface includes a plurality of support flanges forming a seat for maintaining the peripheral device away from the support surface to provide substantially unimpeded air flow underneath the peripheral device.

11. The housing as set forth in claim 1 wherein:

said top portion is arcuately shaped when viewed in longitudinal cross section.

12. The housing as set forth in claim 1 wherein:

said first fastener element includes at least one pair of inwardly inclined barbs; and said second fastener element includes a channel shaped portion for slidable receipt over said barbs.

13. The housing as set forth in claim 1 wherein:

said interior compartment tapers inwardly in the rearward direction.

14. The housing as set forth in claim 10 wherein:

said support flanges are spaced apart to support the lower surface of different sized peripheral devices.

15. The housing as set forth in claim 1 wherein:

said upper and lower halves are formed with recesses for close fitting receipt of side covers and a frontal slot reducer, said recesses being constructed such that the exterior surface of said side covers and said frontal slot reducer is flush with the exterior surface of said domed portion.

16. The housing as set forth in claim 1 wherein:

said interface panel includes at least one opening constructed for receipt of an SCSI port.

17. The housing as set forth in claim 1 wherein:

said interface panel includes at least one opening constructed for receipt of a USB port.

18. The housing as set forth in claim 1 wherein:

said halves are constructed of a rigid plastic material.

19. The housing as set forth in claim 1 wherein:

said interior compartment provides a heat exchange chamber about the peripheral device whereby ambient air is allowed to flow about the peripheral device.

20. The housing as set forth in claim 1 wherein:

said interface panel includes at least one opening constructed for receipt of a parallel port.

21. The housing as set forth in claim 1 wherein:

said interface panel includes at least one opening configured for receipt of a PC card.

22. The housing as set forth in claim 1 wherein:

said lower support surface is arcuately shaped when viewed in longitudinal cross section.

23. The housing as set forth in claim 1 wherein:

said lower support surface includes a plurality of conical anchors constructed to be received in the peripheral for restricting lateral and longitudinal movement of the peripheral within said compartment.

24. The housing as set forth in claim 1 further including:

a frontal slot reducer and a pair of side covers for reinforcing the engagement of said upper and lower halves.

25. The housing as set forth in claim 1 further including a pair of side covers for reinforcing the engagement of said upper and lower halves.

26. A modular external casing for a hardware peripheral comprising:

an upper domed element supported from a pair of downwardly projecting side walls terminating in a first fastening element, said side walls including opposing, inwardly facing, upper panel slots;

a curved lower tray element flanked on both sides by a pair of upwardly projecting side walls terminating in a second fastener element configured for releasable engagement with said first fastener element, said tray further including a series of stand off ribs on its interior surface constructed to provide an elevated seat for the electrical component, said upwardly projecting side walls further including opposed confronting lower panel slots;

an interface panel slidably disposed within said upper and lower panel slots and constructed with an array of interface openings for carrying interface connectors;

wherein said releasable engagement of said upper domed element and said lower tray forms an interior compartment dimensioned for placement of the peripheral and an open rectangular forward slot providing access to the electrical component; and said interior compartment further provides a heat exchange chamber about the peripheral.

* * * * *

UNITED STATES PATENT AND TRADEMARK OFFICE
CERTIFICATE OF CORRECTION

PATENT NO. : 6,147,859

DATED : November 14, 2000

INVENTOR(S) : Pierre Abboud

It is certified that error appears in the above-identified patent and that said Letters Patent is hereby corrected as shown below:

On the Title Page, Item [73] Assignee should read ----- QPS, Inc. -----.

Signed and Sealed this

Twenty-ninth Day of May, 2001

*Attest:*

NICHOLAS P. GODICI

*Attesting Officer*   Acting Director of the United States Patent and Trademark Office